US008569865B2

(12) United States Patent
Stecher

(10) Patent No.: US 8,569,865 B2
(45) **Date of Patent: *Oct. 29, 2013**

(54) INTEGRATED CIRCUIT AND PRODUCTION METHOD

(75) Inventor: Matthias Stecher, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/424,792

(22) Filed: Mar. 20, 2012

(65) Prior Publication Data

US 2012/0175730 A1 Jul. 12, 2012

Related U.S. Application Data

(63) Continuation of application No. 11/687,425, filed on Mar. 16, 2007, now Pat. No. 8,138,575.

(30) Foreign Application Priority Data

Mar. 22, 2006 (DE) ......................... 10 2006 013 203

(51) Int. Cl.
*H01L 21/70* (2006.01)

(52) U.S. Cl.
USPC ........... 257/552; 257/544; 257/546; 257/557; 257/E27.037; 257/197; 257/373; 257/578; 257/592

(58) Field of Classification Search
USPC .......... 257/500, 494, 496, 505, 630, E29.019, 257/544, 546, 547, 552, 557, E27.037
See application file for complete search history.

(56) References Cited

U.S. PATENT DOCUMENTS

| | | | | |
|---|---|---|---|---|
| 5,021,860 | A * | 6/1991 | Bertotti et al. | 257/552 |
| 5,049,521 | A | 9/1991 | Belanger et al. | |
| 5,065,216 | A | 11/1991 | Suzuki et al. | |
| 5,072,274 | A | 12/1991 | Kokado | |
| 5,449,946 | A | 9/1995 | Sakakibara et al. | |
| 5,545,917 | A | 8/1996 | Peppiette et al. | |
| 5,856,700 | A | 1/1999 | Woodbury | |
| 5,889,314 | A | 3/1999 | Hirabayashi | |
| 6,008,512 | A | 12/1999 | Beasom | |
| 6,130,458 | A | 10/2000 | Takagi et al. | |
| 6,362,064 | B2 | 3/2002 | McGregor et al. | |
| 6,541,314 | B2 | 4/2003 | Kobayashi | |
| 6,750,526 | B2 * | 6/2004 | Nakashima | 257/509 |
| 2003/0136990 | A1 | 7/2003 | Rossmeier et al. | |

FOREIGN PATENT DOCUMENTS

| | | |
|---|---|---|
| DE | 10202479 | 8/2003 |
| EP | 0292972 | 11/1988 |

OTHER PUBLICATIONS

Non-Final Office Action mailed Aug. 21, 2008 in U.S. Appl. No. 11/687,425.
Final Office Action mailed Mar. 6, 2009 in U.S. Appl. No. 11/687,425.
Non-Final Office Action mailed Aug. 19, 2009 in U.S. Appl. No. 11/687,425.
M. Stecher et al., "Key Technologies for System-Integration in the Automotive and Industrial Applications", IEEE Transactions on Power Electronics, vol. 20, No. 3, May 2005 (pp. 537-549).
Non-Final Office Action mailed Apr. 14, 2010 in U.S. Appl. No. 11/687,425.
Final Office Action mailed Sep. 16, 2010 in U.S. Appl. No. 11/687,425.

* cited by examiner

*Primary Examiner* — S. V. Clark
*Assistant Examiner* — Jesse Y Miyoshi
(74) *Attorney, Agent, or Firm* — Dicke, Billig & Czaja, PLLC

(57) ABSTRACT

An integrated circuit and a production method is disclosed. One embodiment forms reverse-current complexes in a semiconductor well, so that the charge carriers, forming a damaging reverse current, cannot flow into the substrate.

18 Claims, 6 Drawing Sheets

INTEGRATED CIRCUIT AND PRODUCTION METHOD

CROSS-REFERENCE TO RELATED APPLICATIONS

This Utility patent application is a continuation application of U.S. application Ser. No. 11/687,425, filed Mar. 16, 2007, which claims priority to German Patent Application No. DE 10 2006 013 203.3 filed on Mar. 22, 2006, which are both incorporated herein by reference.

BACKGROUND

The invention relates to an integrated circuit having a semiconductor arrangement. Such an integrated semiconductor arrangement can be, for example, as a power transistor, a DMOS, HVMOS, MedV-MOS, LowV-MOS or bipolar transistor which, together with other components, is provided in a semiconductor body.

It has been found that in such integrated semiconductor arrangements, if, for example, an N-DMOS transistor with an n-type conducting drain zone is operated in a low-side application, the potential of this drain zone can be pulled, by a short circuit or by an inductive load, to a value which is less than 0 V compared with a p-type conducting insulation region. In this mode, the drain substrate diode is polarized in the forward direction and very large currents up to several amperes can flow into the substrate. In the case of N-DMOS transistors, electrons are minority charge carriers in the substrate.

In this respect, reference is made to the attached FIG. 1 in which, in a section drawn on the left and designated by I of a semiconductor body, on or in a p-type substrate 1 in a first semiconductor well 4*a*, an N-DMOS transistor is located which is here illustrated diagrammatically by its $n^+$-type doped drain zone 9 extending up to the top main area H and which carries a negative injection potential $V_{inj}<0$ V injecting a reverse current. Furthermore, in a second section of the semiconductor body illustrated in FIG. 1, drawn on the right and designated by II, in a second n-type semiconductor well 4*b* semiconductor zones 6, 7 of different conduction type, e.g., semiconductor zones of a PMOS and of an NMOS transistor are formed from the main area H. The semiconductor zones 6 of the PMOS transistor are located in an n-type doped semiconductor well 5*a* and the semiconductor zones 7 of the NMOS transistor are formed in an adjoining p-type semiconductor well 5*b*, both of which are formed next to one another in the aforementioned second semiconductor well 4*b*. Between the p-type substrate 1 and the first semiconductor well 4*a*, on the one hand, and the p-type substrate 1 and the second semiconductor well 4*b*, on the other hand, $n^+$-type doped buried layers 2*a* and 2*b* are in each case located. The buried layer 2*a* is connected to the drain electrode 9 of the N-DMOS transistor in the depth of the first semiconductor well 4*a* whereas the buried layer 2*b* is connected to a particular well potential $V_{n\text{-}well}$ via an $n^+$-type sinker 3. Furthermore, a respective gate potential $V_G$ is applied to the gate terminals of in each case the PMOS transistor and of the NMOS transistor in the second semiconductor well 4*b* in FIG. 1.

The negative charge carriers injected from the drain zone 9 pulled to under the p-type substrate potential in the case described are illustrated with arrows designated by the symbol e in FIG. 1. These injected charge carriers flow from the drain zone 9 via the substrate into the $n^+$-type sinker 3 and can lead to a malfunction or to the destruction of the chip. This problem or malfunction can not always be solved with a $p^+$-type insulation indicated with the reference number 8 in FIG. 1.

FIG. 2 illustrates a guard ring design hitherto used, which in comparison with the semiconductor arrangement of FIG. 1, is formed by an additional second $p^+$-type insulation 8*b*. The electrons $e^-$ injected from the drain zone 9 of an adjacent N-DMOS transistor are marked by arrows. The pattern, illustrated in FIG. 2, with the two active guard rings 8*a*, 8*b* extending into the p-type substrate 1 is efficient without trench insulation because more than 80% of the electrons injected into the substrate is injected into the $p^+$-type insulation 8*a*, 8*b* on the surface. Fewer electrons are injected via the buried layer 2*b* because the connection of the $n^+$-type sinker 3 with the buried layer 2*b* is some ohms. The greatest voltage drop thus exists between the injecting n-type well 4*a* and the p-type substrate 1 on the surface. The regions 9, 8 and 3 form a bipolar transistor which turns itself off, 9 forming its emitter, 8 forming its base and 3 forming its collector. Base 8 and collector 3 are short circuited in this arrangement.

If trenches were then used for insulating the injecting components, i.e. of the drain zone 9, indicated on the left in FIG. 2, of the N-DMOS power transistor, the electrons $e^-$ would be injected into the substrate essentially via the buried layer 2*a*. However, the active guarding pattern according to FIG. 2 could then no longer be constructed. Surface guard rings cannot absorb the injected electrons.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
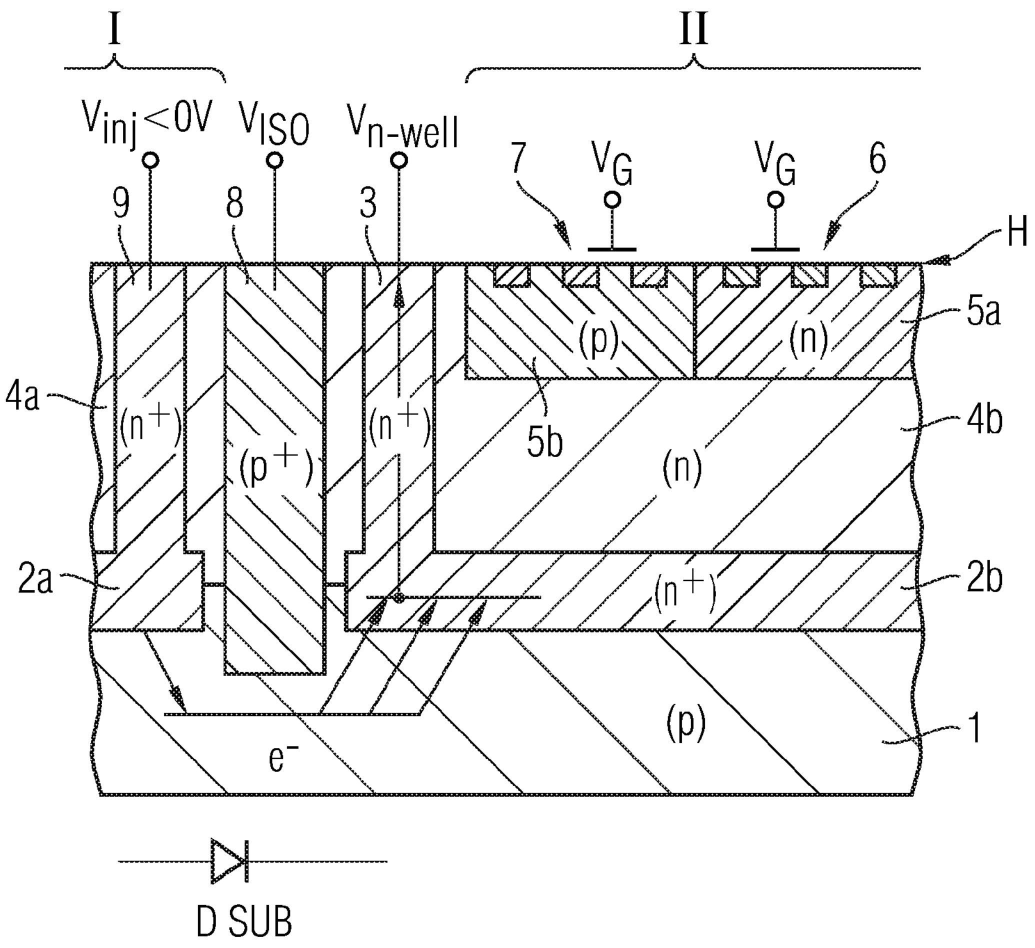
FIG. 1 illustrates a diagrammatic cross section through an integrated semiconductor arrangement, already explained initially, with a power transistor, by which the problems to be solved by the invention have been described.
Figure 2:
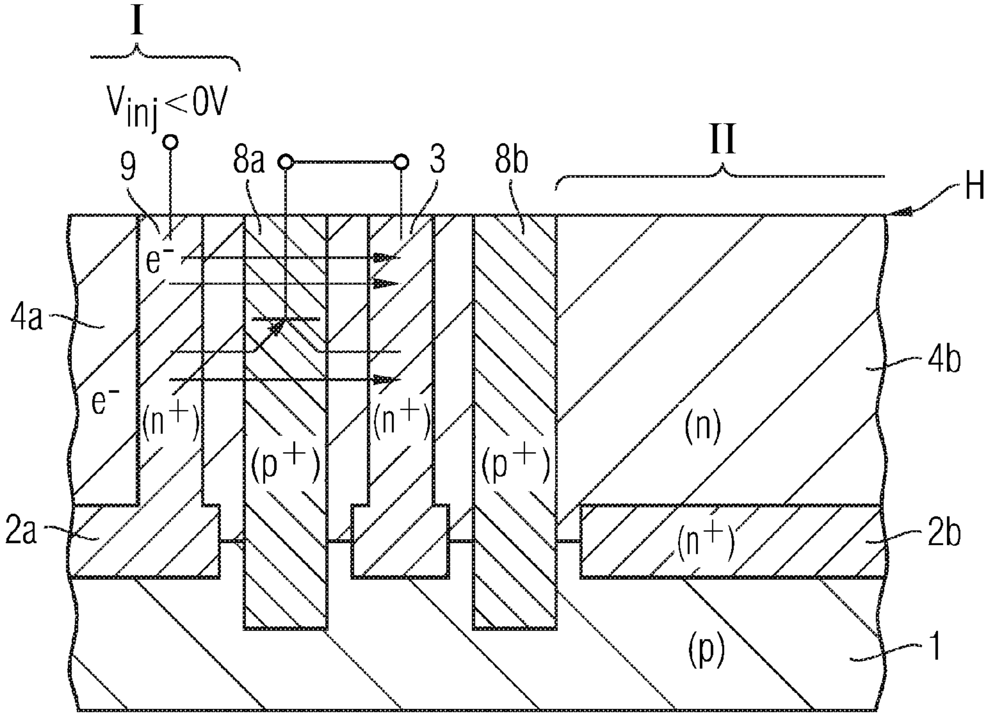
FIG. 2 illustrates a diagrammatic cross section through a semiconductor arrangement approximately according to FIG. 1 but with an active guard ring pattern.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide an integrated circuit having a semiconductor arrangement. One embodiment includes a first and second semiconductor well, both of which are formed with the same second conduction type adjacently to one another and insulated from one another in the same substrate of the first conduction type and which define a main area of the semiconductor arrangement, wherein electrode patterns of a power transistor are formed in the first semiconductor well and semiconductor zones of a different conduction type are formed in the second semiconductor well and the insulation between the first and second semiconductor well is formed by an insulating material placed in at least one deep trench extending from the main area into the substrate, and a production method therefor.

One or more embodiments provide a generic integrated circuit having a semiconductor arrangement with trench insulation and a production method therefor, in such a manner that the problems described above can be avoided so that the electrons injected by a semiconductor well containing a power transistor in the case where its electrode zone, e.g., drain zone is pulled below the substrate potential, cannot lead to a malfunction of the other patterns of the semiconductor arrangement.

Achievement of this, is based on the principle of carrying the local substrate potential below the power transistor along with the potential of the well in which the power transistor is located so that the difference between the two potentials is as close as possible to the forward voltage of the diode formed between the semiconductor well and the substrate.

In accordance with this principle, the above is achieved, according to a first embodiment, via an integrated semiconductor arrangement including a first and second semiconductor well, both of which are formed with the same second conduction type adjacently to one another and insulated from one another in the same substrate of the first conduction type and which define a main area of the semiconductor arrangement, wherein electrode patterns of a power transistor are formed in the first semiconductor well and semiconductor zones of a different conduction type are formed in the second semiconductor well and the insulation between the first and second semiconductor well is formed by an insulating material placed in at least one deep trench extending from the main area into the substrate, wherein the semiconductor arrangement also has at least one reverse-current complex formed between an electrode pattern injecting a reverse current of the power transistor and the trench insulation, which is in each case a reverse-current-injection-absorbing semiconductor zone of the second conduction type located in a third semiconductor well of the first conduction type formed in the first semiconductor well, wherein the third semiconductor well extends from the main area into the first semiconductor well and is connected to ground potential or to a potential which is more negative compared with the former, and the reverse-current-absorbing semiconductor zone is connected to the substrate via a substrate connection.

In an embodiment of the semiconductor arrangement, the first conduction type can be the p-type of conduction and the second conduction type can be the n-type of conduction.

According to one embodiment, a number of distributed reverse-current complexes can be formed in the first semiconductor well and can be short circuited with a substrate contact ring surrounding the latter. Furthermore, a buried layer of the second conduction type can be formed between the substrate and at least the first semiconductor well and can be there connected to the reverse-current-injecting pattern of the power transistor in the embodiment.

A further buried layer of the second conduction type can furthermore be formed between the substrate and the second semiconductor well.

In one embodiment of the semiconductor arrangement, the power transistor formed therein is used as a low-side power transistor. It should be noted here that the problem described initially does not occur in typical high-side applications since in the latter case, holes are injected instead of electrons. However, there are also abnormal occurrences in high-side DMOS applications where this problem occurs.

The power transistor located in the first semiconductor well of the semiconductor arrangement according to the invention can be optionally a DMOS, HVMOS, MedV-MOS, LowV-MOS or also a bipolar transistor.

According to another embodiment, the above is also achieved by a method for producing an integrated semiconductor arrangement, in which

- in a single substrate of a first conduction type, adjacently to one another and insulated from one another, a first and second semiconductor well of the opposite second conduction type are formed which define a main area of the semiconductor arrangement;
- electrode patterns of a power transistor are formed in the first semiconductor well and semiconductor zones of a different conduction type are formed in the second semiconductor well, and
- between the first and second semiconductor well, at least one deep trench extending from the main area into the substrate is formed and an insulating material producing the insulation between the first and second semiconductor well is placed in the former, wherein the method also has the following processes:

- forming at least one reverse-current complex in each case in a third semiconductor well of the first conduction type, which is formed between an electrode pattern, injecting a reverse current, of the power transistor and the trench insulation within the first semiconductor well, and
- that, for forming the reverse-current complex, the third semiconductor well is connected to ground potential or to a potential which is more negative with respect to the former, a semiconductor zone of the second conduction type, absorbing an injected reverse current, is formed from the main area in the third semiconductor well and is connected to the substrate via a substrate connection.

In the text which follows, embodiments of an integrated semiconductor arrangement are explained which, for example, contains an N-DMOS transistor as power transistor and in which, for example, the first conduction type is the p-type conduction type and a second conduction type is the n-type conduction type. Naturally, the concept of a reverse-current complex described in the text which follows also applies to the use of other types of power transistors, e.g., for HVMOS, MedV-MOS, LowV-MOS or bipolar transistors, as long as there is a well pattern injecting a reverse current. Naturally, this concept also applies if the conduction types or dopings are inverted (using the n-type conduction type instead of the p-type conduction type and the p-type conduction type instead of the n-type conduction type).

Figure 3A:
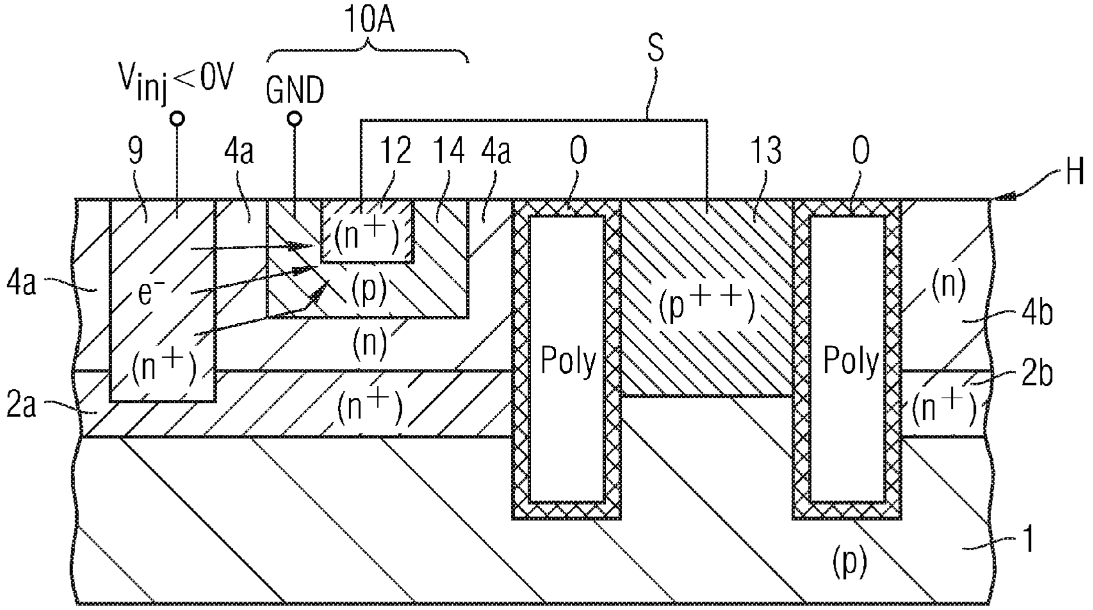
FIG. 3A illustrates a diagrammatic cross section of a first exemplary embodiment of a semiconductor arrangement according to the invention, in which a first embodiment of a reverse-current complex for reducing reverse-current injection is realized.

According to the cross-sectional representation of FIG. 3A, which illustrates a basic structure of an integrated semiconductor arrangement, a first n-type conducting well 4*a* and a second n-type conducting well are formed adjacently to one another and insulated from one another in a common p-type conducting substrate 1. The two semiconductor wells 4*a* and 4*b* define with their surfaces a main area H of the semiconductor arrangement. In the first semiconductor well 4*a*, semiconductor zones of an N-DMOS transistor are formed, only an $n^+$-type drain zone 9 is illustrated in FIG. 3A. In the second semiconductor well 4*b*, semiconductor zones of different conduction type, not illustrated in FIG. 3A, can be formed such as, e.g., semiconductor zones of CMOS elements (compare FIG. 1). Insulation between the first semiconductor well 4*a* and the second semiconductor well 4*b* consists of two intermediate deep trenches extending into the substrate 1, which are formed with an insulating material O. The latter only lines the deep trenches whereas the filling material mainly consists of polysilicon (Poly). Between the insulating material O present in the deep trenches, a $p^{++}$-type substrate connection 13 is present.

For the well potential of the first n-type semiconductor well 4*a* to track the substrate potential below the DMOS transistor (illustrated by its drain zone 9), a bipolar transistor which shuts itself off and which forms a reverse-current complex 10A is provided in the former. To form this bipolar transistor, which shuts itself off, a p-type conducting semiconductor well 14, connected to ground potential GND or to a potential which is more negative in comparison with it is placed in the first n-type semiconductor well 4*a*. In this semiconductor well 14, an $n^+$-type region 12 is located which is short circuited with the substrate 1 via the substrate connection 13 by a short circuit bridge S. If then the first n-type semiconductor well 4*a* of the semiconductor arrangement becomes negative, which happens when the drain 9 of the N-DMOS power transistor is pulled below the potential of the p-type conducting substrate 1 ($V_{inj}$<0 V), electrons e are injected into the $n^+$-type region 12, which is short circuited with the p-type substrate 1, of the reverse-current complex 10A (see arrows $e^-$). The potential of the p-type substrate 1 thus follows that of the $n^+$-type region 12 and thus the first n-type semiconductor well 4*a* which is negatively polarized.

Since electrons can be injected over the entire bottom of such a trench-insulated DMOS transistor, this construction must be distributed over a large area of the first n-type conducting well 4*a*. This will be explained in greater detail below by FIGS. 4A and 4B.

It must also be mentioned that below the first and second n-type well 4*a* and 4*b*, a buried $n^+$-type layer 2*a* and 2*b* is in each case located, i.e. between the two n-type semiconductor wells 4*a* and 4*b* and the substrate 1 similar to how it has been explained by FIG. 1. It is also illustrated that the buried $n^+$-type layer 2*a* below the first n-type semiconductor well 4*a* is connected there to the bottom of the drain zone 9.

Figure 3B:
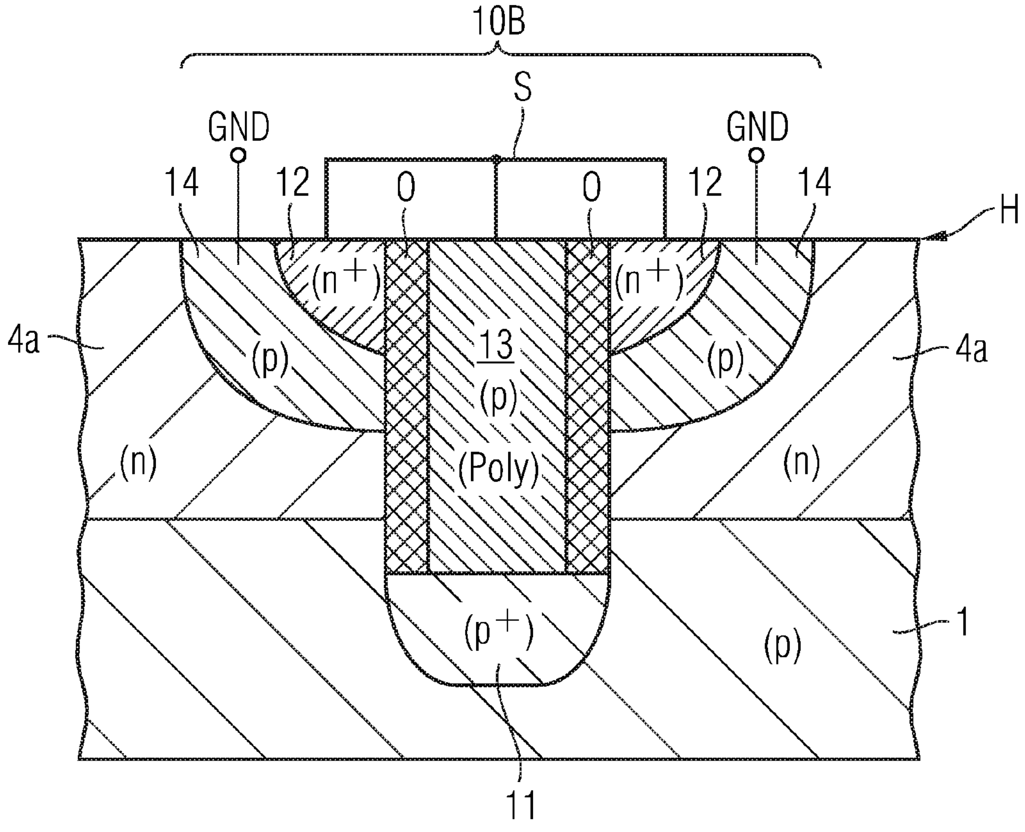
FIG. 3B illustrates a diagrammatic cross section of a first variant of the reverse-current complex according to FIG. 3A.

FIG. 3B illustrates in a diagrammatic cross section an exemplary embodiment which is alternative to the design of the reverse-current complex 10A and the insulating deep trench according to FIG. 3A and is designated by 10B in FIG. 3B. In this arrangement, the substrate contact 13 reinforced by a $p^+$-type contact reinforcement 11 within the p-type substrate 1, which itself consists of p-type conducting polysilicon (Poly), is itself placed in a deep trench extending into the p-type substrate 1, the side walls of which are walls lined with insulating oxide O or another insulating dielectric. The bipolar transistor, which shuts itself off in the case of the reverse-current injection, with the $n^+$-type semiconductor region 12 absorbing the injected reverse current is located on both sides or around this deep trench lined with insulating oxide O and filled with p-type conducting polysilicon as substrate contact 13 and consists of the p-type well 14 formed in the n-type conducting first semiconductor well 4*a* and connected to ground potential GND and the $n^+$-type region 12 placed therein, which, as previously in the exemplary embodiment illustrated in FIG. 3A, is short circuited with the potential of the p-type substrate 1 via the substrate contact 13 (short circuit bridge S).

Figure 3C:
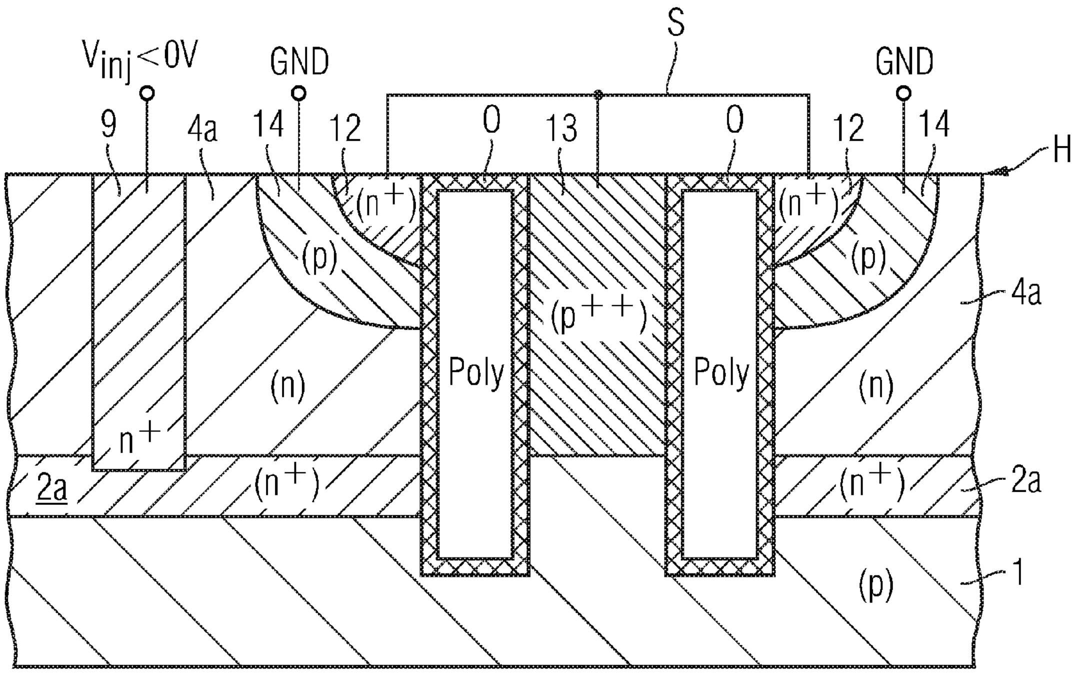
FIG. 3C illustrates in a diagrammatic cross section a second variant of the reverse-current complex according to FIG. 3A.

A third embodiment illustrated in the form of a diagrammatic cross section in FIG. 3C combines the structures of the reverse-current complex, of the insulating deep trenches and of the substrate connection, illustrated in FIGS. 3A and 3B. The structure of the deep trenches lined with insulating oxide O and of the substrate contact 13 placed between them thus resembles the arrangement of FIG. 3A whereas the structure of the bipolar transistor formed in the first semiconductor well 4*a*, which shuts itself off and absorbs the reverse-current injection, resembles the arrangement of FIG. 3B since it is provided around the insulating deep trenches or on both sides of these as in FIG. 3B. In FIG. 3C, too, similar to FIG. 3A, a buried $n^+$-type layer is placed between the p-type substrate 1 and the n-type conducting first semiconductor well 4*a*, which is connected to the bottom area of the drain zone 9 of the N-DMOS transistor. It must be noted that the substrate contact 13, instead of in the manner of FIGS. 3A-3C, can also be arranged in a different way, e.g., by the trench lined with oxide O being filled with metal, graphite or with $n^+$-type conducting material and connected to the contact reinforcement 11 according to FIG. 3B by a salicide film. Although the p-type well 14 of the exemplary embodiments of the reverse-current complex 10A, 10B according to FIGS. 3A-3C is connected to ground potential GND, it can also be connected to a more negative potential than GND, instead.

Figure 4A:
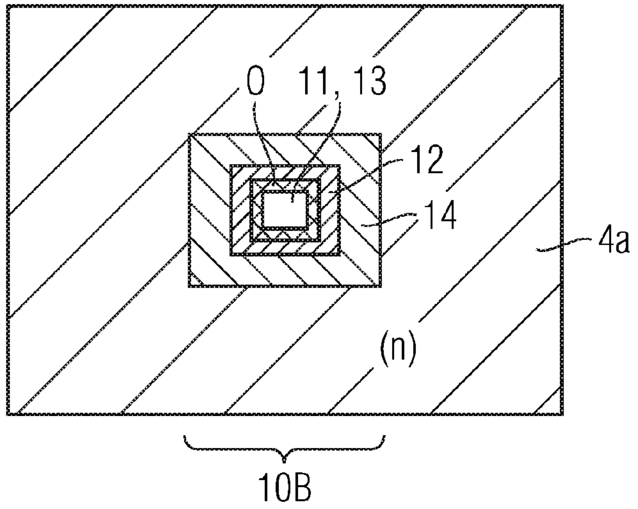
FIG. 4A illustrates a diagrammatic layout representation of a reverse-current complex according to FIG. 3B in the center of an injecting n-type well.

According to FIG. 4A, such a reverse-current complex 10B according to FIG. 3B is located, for example, in the center of an injecting n-type well, that is the first semiconductor well 4*a*. The reference symbols 11-14 and O designate the same elements and arrangements as in FIG. 3B. Instead of arranging the reverse-current complex 10B in the center of an injecting n-type conducting semiconductor well 4*a* as illustrated in FIG. 4A, such a reverse-current complex or a number of the reverse-current complexes formed according to the invention can be arranged on the outer edge of the injecting n-type semiconductor well 4*a*.

Figure 4B:
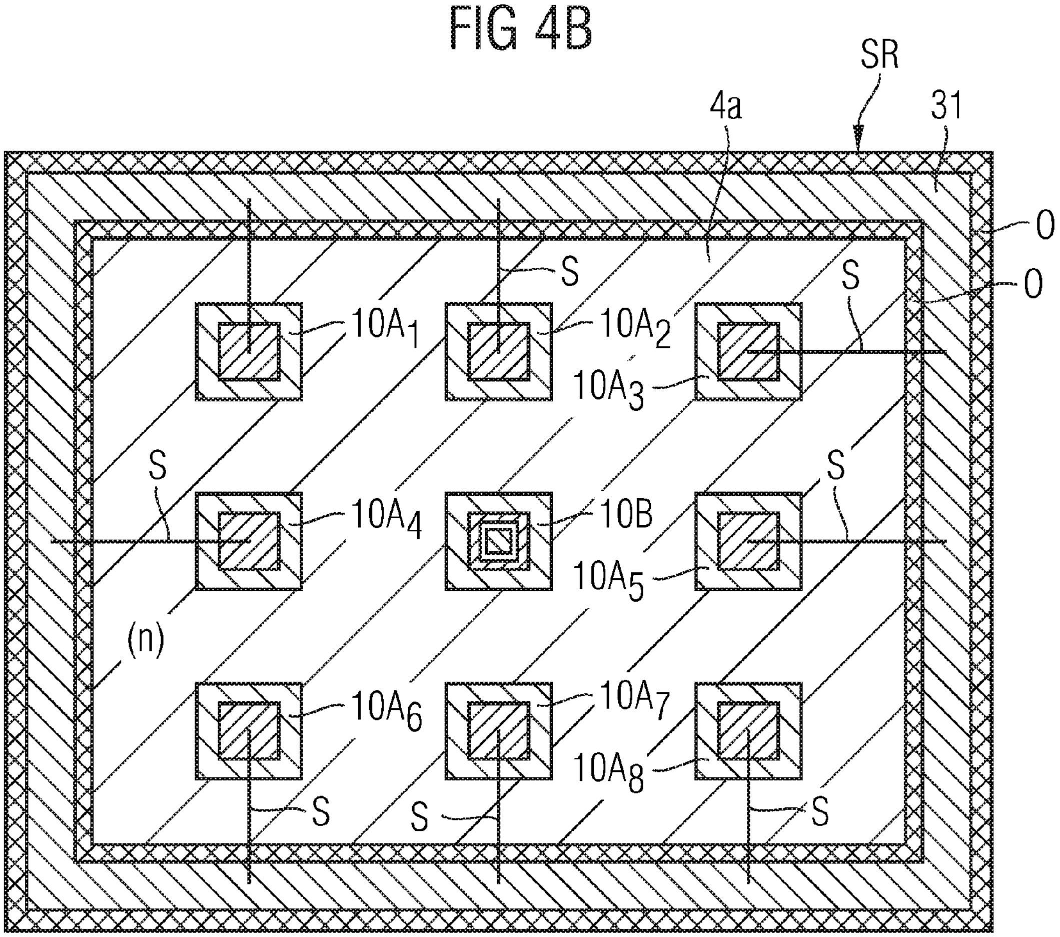
FIG. 4B illustrates in a diagrammatic layout view a possible arrangement of a number of reverse-current complexes in which these are short circuited with a p-type substrate ring lying on the outside.

FIG. 4B illustrates a diagrammatic layout view of an alternative arrangement in which a number of reverse-current complexes 10A1-10A8 and 10B are distributed within a section of the injecting n-type semiconductor well 4*a*, which is surrounded by an outer substrate contact ring SR. The reverse-current complexes 10A1-10A8 adjacent to the substrate contact ring SR are short circuited by short circuit bridges S to the substrate (not illustrated) via a substrate contact 31 present in the substrate contact ring SR. Accordingly, it is not necessary to draw the reverse-current complexes around the entire outer edge of the injecting n-type semiconductor well 4*a*. With respect to the exemplary embodiment illustrated in FIG. 4B, it must be noted that the reverse-current complexes 10A1-10A8 adjacent to the substrate contact ring SR correspond to the exemplary embodiment illustrated in FIG. 3A whereas the centrally located reverse-current complex 10B corresponds to the exemplary embodiment illustrated in FIG. 3B. The further reference symbols in FIG. 4B designate elements which are identical with the elements in FIGS. 3A-3C designated by the same reference symbols. As an alternative to the embodiment illustrated in FIG. 4B, the reverse-current complexes 10$A_1$-10$A_8$ or a part of them can be placed at the inner part, i.e. in the substrate contact 31 of the surrounding substrate contact ring SR. This would avoid using the short circuit bridge S.

The preceding explanation of the embodiments according to FIGS. 3A-3C, 4A and 4B also describes a method for producing an integrated semiconductor arrangement, in which

- in a single substrate of a first conduction type, adjacently to one another and insulated from one another, a first and second semiconductor well of the opposite second conduction type are formed which define a main area of the semiconductor arrangement;
- electrode patterns of a power transistor are formed in the first semiconductor well and semiconductor zones of a different conduction type are formed in the second semiconductor well, and
- between the first and second semiconductor well, at least one deep trench extending from the main area into the substrate is formed and an insulating material producing the insulation between the first and second semiconductor well is placed in the former,
- wherein the method also has the following processes:
- forming at least one reverse-current complex in each case in a third semiconductor well of the first conduction type, which is formed between an electrode pattern, injecting a reverse current, of the power transistor and the trench insulation within the first semiconductor well, and
- that, for forming the reverse-current complex, the third semiconductor well is connected to ground potential or to a potential which is more negative with respect to the former, a semiconductor zone of the second conduction type, absorbing an injected reverse current, is formed from the main area in the third semiconductor well and is connected to the substrate via a substrate connection.

This method enables an integrated circuit having a semiconductor arrangement to be produced in which, in order to avoid damaging effects of charge carriers, injected, e.g., from an n-type semiconductor well, in the case where an electrode, e.g., a drain electrode of an N-DMOS transistor, when driving an inductive load in a low-side application of the power transistor is pulled below the substrate potential, the local substrate potential below the power transistor tracks the well potential by forming reverse-current complexes so that the difference between the two potentials is as close as possible to the forward voltage of a diode formed between the well and the substrate.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:

a semiconductor substrate of a first conductivity type;

a first semiconductor well and a second semiconductor well, each of a second conductivity type formed adjacently to one another and insulated from one another in the same semiconductor substrate, wherein surfaces of the first semiconductor well, and the second semiconductor well define a main area;

electrode patterns of a power transistor including a reverse-current injecting electrode pattern of the power transistor are formed in the first semiconductor well;

an insulating material placed in a deep trench structure extending from the main area into the semiconductor substrate for providing insulation between the first semiconductor well and the second semiconductor well, the deep trench structure comprising two intermediate trenches extending into the semiconductor substrate, wherein the two intermediate trenches are lined with an insulating material and filled with a material comprised of polysilicon;

a third semiconductor well of the first conductivity type extending from the main area into the first semiconductor well such that the third semiconductor well is provided between the main area and the first semiconductor well, the third semiconductor well directly connectable to ground potential or to a potential which is more negative compared with the ground potential; and at least one reverse-current complex formed between the reverse-current injecting electrode pattern of the power transistor and the insulating material, said at least one reverse current complex having in each case a reverse-current-absorbing semiconductor zone of the second conductivity type which is located in the third semiconductor well and connected to the semiconductor substrate via a substrate connection extending through the deep trench structure between the insulating material of the two intermediate trenches.

2. The integrated circuit of claim 1, comprising:

electrode patterns of a power transistor are formed in the first semiconductor well.

3. The integrated circuit of claim 2, comprising:

semiconductor zones formed in the second semiconductor well and insulation between the first and second semiconductor well is formed by an insulating material placed in at least one deep trench extending from the main area into the substrate.

4. The integrated circuit of claim 3, comprising:

at least one reverse-current complex, formed between an electrode pattern injecting a reverse current of the power transistor and the trench insulation, which in each case has the reverse-current-injection-absorbing semiconductor zone, located in the third semiconductor well formed in the first semiconductor well.

5. The integrated circuit of claim 3, comprising:

wherein the third semiconductor well extends from the main area into the first semiconductor well and is connected to ground potential or to a potential which is more negative compared with the former.

6. The integrated circuit of claim 1, comprising wherein the substrate is formed of a first conduction type and the first semiconductor and the second semiconductor is formed of a second conduction type.

7. The integrated circuit of claim 1, comprising wherein a number of distributed reverse-current complexes are formed in the first semiconductor well.

8. The integrated circuit of claim 7, comprising where the reverse-current complexes are short circuited with a substrate contact ring surrounding the reverse-current complexes.

9. The integrated circuit of claim 1, comprising wherein a buried layer is formed between the substrate and at least the first semiconductor well and is connected to the reverse-current-injecting pattern of the power transistor.

10. The integrated circuit of claim 9, comprising wherein a further buried layer is formed between the substrate and the second semiconductor well.

11. The integrated circuit of claim 1, wherein the electrode patterns of a power transistor form a DMOS, HVMOS, MedV-MOS, LowV-MOS transistor or a bipolar transistor.

12. An integrated circuit having a semiconductor arrangement comprising:

a first semiconductor well and a second semiconductor well, both of which are formed with the same second conduction type adjacently to one another and insulated from one another in a semiconductor substrate of the first conduction type and which define a main area of the semiconductor arrangement, wherein electrode patterns of a power transistor including a reverse current injecting electrode pattern are formed in the first semiconductor well, and semiconductor zones having conduction types differing from one another are formed in the second semiconductor well, and an insulation between the first semiconductor well and the second semiconductor well is formed by an insulating material placed in a deep trench structure extending from the main area into the semiconductor substrate, the deep trench structure comprising two intermediate trenches extending into the semiconductor substrate, wherein the two intermediate trenches are lined with an insulating material and filled with a material comprised of polysilicon; and at least one reverse-current complex, formed between the reverse-current injecting electrode pattern of the power transistor and a trench insulation, the at least one reverse-current complex having in each case a reverse-current-absorbing semiconductor zone of the second conduction type located in a third semiconductor well of the first conduction type formed in the first semiconductor well;

wherein the third semiconductor well extends from the main area into the first semiconductor well and is directly connectable to ground potential or to a potential which is more negative compared with the ground potential, and the reverse-current-absorbing semiconductor zone is connected to the semiconductor substrate via a substrate connection extending through the deep trench structure, the deep trench structure comprising two intermediate trenches extending into the semiconductor substrate, wherein the two intermediate trenches are lined with an insulating material and filled with a material comprised of polysilicon, wherein a buried layer of the second conduction type is formed between the substrate and at least the first semiconductor well and is there connected to the reverse-current-injecting electrode pattern of the power transistor, and wherein a further buried layer of the second conduction type is formed between the substrate and the second semiconductor well.

13. The integrated circuit of claim 12, comprising wherein the first conduction type is the p-type of conduction and the second conduction type is the n-type of conduction.

14. The integrated circuit of claim 12, comprising wherein a number of distributed reverse-current complexes are formed in the first semiconductor well.

15. The integrated circuit of claim 14, comprising wherein the reverse-current complexes are short circuited with a substrate contact ring surrounding the reverse-current complexes.

16. The integrated circuit of claim 12, comprising wherein a buried layer of the second conduction type is formed between the substrate and at least the first semiconductor well and is there connected to the reverse-current-injecting pattern of the power transistor.

17. The integrated circuit of claim 16, comprising wherein a further buried layer of the second conduction type is formed between the substrate and the second semiconductor well.

18. The semiconductor arrangement of claim 12, comprising wherein the power transistor is a DMOS, HVMOS, MedV-MOS, LowV-MOS transistor or a bipolar transistor.

* * * * *